(12) United States Patent
Cox et al.

(10) Patent No.: US 9,436,497 B2
(45) Date of Patent: Sep. 6, 2016

(54) LINKING MULTIPLE INDEPENDENT CONTROL SYSTEMS TO DISTRIBUTE RESPONSE

(71) Applicant: Apple Inc., Cupertino, CA (US)

(72) Inventors: Keith Cox, Campbell, CA (US);
Kit-Man Wan, Cupertino, CA (US);
Michael F. Culbert, Monte Sereno, CA (US)

(73) Assignee: Apple Inc., Cupertino, CA (US)

(*) Notice: Subject to any disclaimer, the term of this patent is extended or adjusted under 35 U.S.C. 154(b) by 414 days.

(21) Appl. No.: 13/919,945

(22) Filed: Jun. 17, 2013

(65) Prior Publication Data

US 2014/0074313 A1 Mar. 13, 2014

Related U.S. Application Data

(60) Provisional application No. 61/699,279, filed on Sep. 10, 2012.

(51) Int. Cl.
*G06F 9/46* (2006.01)
*G05D 23/19* (2006.01)
*H01L 23/34* (2006.01)
*G06F 1/20* (2006.01)

(52) U.S. Cl.
CPC .................. *G06F 9/46* (2013.01); *G05D 23/19* (2013.01); *G05D 23/1919* (2013.01); *G06F 1/206* (2013.01); *H01L 23/34* (2013.01); *H01L 2924/0002* (2013.01)

(58) Field of Classification Search
CPC ......... G06F 9/46; G06F 1/206; H01L 23/34; H01L 2924/0002; G05D 23/1919; G05D 23/19

See application file for complete search history.

(56) References Cited

U.S. PATENT DOCUMENTS

| | | | | |
|---|---|---|---|---|
| 5,791,160 A | * | 8/1998 | Mandler | F25J 1/0022 62/611 |
| 6,574,082 B2 | * | 6/2003 | Vitek | H05K 7/207 361/103 |
| 7,307,245 B2 | * | 12/2007 | Faries, Jr. | A61J 1/1475 165/254 |
| 8,103,893 B2 | * | 1/2012 | Burton | G06F 1/206 713/324 |
| 8,201,416 B2 | * | 6/2012 | Liao | G05D 23/1931 165/104.33 |
| 2005/0156492 A1 | | 7/2005 | Utke | |
| 2009/0177310 A1 | | 7/2009 | Dao et al. | |
| 2010/0070082 A1 | | 3/2010 | Chessel et al. | |

(Continued)

OTHER PUBLICATIONS

PCT Application No. PCT/US2013/058723—International Search Report and Written Opinion dated Dec. 16, 2013.

*Primary Examiner* — Ramesh Patel
(74) *Attorney, Agent, or Firm* — Downey Brand LLP

(57) ABSTRACT

A linked multiple independent control system can include two or more independent controllers configured to cooperatively control operating points of a system. In one particular embodiment, the linked multiple independent control system can control operating temperatures of a computing device. In one embodiment, the independent controllers can operate in parallel to develop control effort signals that are used by the computing device to affect operating parameters of one or more components included in the computing device. In another embodiment, independent controllers can have independent temperature thresholds that can affect control effort signals only from the related controller.

20 Claims, 6 Drawing Sheets

(56) References Cited

U.S. PATENT DOCUMENTS

| | | |
|---|---|---|
| 2011/0015803 A1 | 1/2011 | Ohata |
| 2012/0048467 A1* | 3/2012 | Mahadeswaraswamy ................ H01J 37/32522 156/345.27 |
| 2012/0072157 A1 | 3/2012 | Alameh et al. |
| 2012/0074238 A1* | 3/2012 | Morita ................ F02D 13/0249 237/5 |
| 2012/0158206 A1* | 6/2012 | Longobardi ......... G05B 13/048 700/300 |
| 2012/0209449 A1* | 8/2012 | Alon ....................... G06F 1/206 700/300 |
| 2012/0217316 A1* | 8/2012 | Byquist .................... G01K 7/42 236/1 C |
| 2014/0072015 A1* | 3/2014 | Han ........................ G01K 7/02 374/179 |

* cited by examiner

LINKING MULTIPLE INDEPENDENT CONTROL SYSTEMS TO DISTRIBUTE RESPONSE

CROSS REFERENCE TO RELATED APPLICATIONS

This application claims the benefit of U.S. Provisional Application No. 61/699,279, filed Sep. 10, 2012 and entitled "LINKING MULTIPLE INDEPENDENT CONTROL SYSTEMS TO DISTRIBUTE RESPONSE" which is incorporated by reference herein in its entirety for all purposes.

FIELD OF THE DESCRIBED EMBODIMENTS

The described embodiments relate generally to control and more particularly to linking multiple independent control systems to control a response attribute of a computing device.

BACKGROUND

Control systems are widely used to monitor and control systems and machines in a multitude of applications. One example of a popular, yet simple application of a control system is a residential thermostat for controlling a furnace. A homeowner can set the thermostat for a desired temperature, and when the temperature of the interior of the house falls below a first threshold temperature, the thermostat can turn on the furnace. The furnace runs until the temperature of the interior exceeds a second threshold temperature. Typically, the first and second threshold temperatures are closely related to the selected desired temperature. In this manner the thermostat acts as a simple control system to regulate the temperature of the house.

Similar to a house, a computing device can have a control system to regulate internal temperatures. In stark contrast, however, the computing device can include many more heat sources. The operation of the heat sources all contribute to product heat, but in varying amounts and in some cases the varying amounts can be in response to applications or other tasks being performed by the computing device. Also, a main function of a temperature regulating control system in a computing device is not to elevate a temperature, but rather work to ensure that the internal temperature does not increase beyond a critical temperature that can cause damage to one or more internal components of the computing device.

Because of the complex nature of computing devices, the simple control system outlined above may not provide acceptable cooling performance. For example, a simple cooling system can typically take only one approach to cooling, independent of factors such as user experience, pending and executing software applications, and previous operating temperatures.

Therefore, what is desired is a way to control a system, such as a cooling system, that can offer multiple control approaches depending on current and past operating parameters.

SUMMARY OF THE DESCRIBED EMBODIMENTS

This paper describes various embodiments that relate to personal computer systems and computing devices, and linking multiple independent control systems to control a response attribute of a computing device.

According to one embodiment of the invention, a method of controlling an attribute of a computing device includes determining a current value of the attribute associated with at least a portion of the computing device, determining a plurality of control effort values based on the current value of the attribute for each controller of a plurality of independent linked controllers, selecting a maximal control effort of the plurality of control effort values, and applying the maximal control effort to manipulate the attribute.

According to another embodiment of the invention, a method of controlling a temperature of a computing device includes determining a current operating temperature of at least a portion of the computing device and computing a first temperature management effort value when the operating temperature is greater than a first temperature threshold. The first temperature management effort value is limited to a first value. The method further includes computing a second temperature management effort value when the operating temperature is greater than a second temperature threshold. The second temperature threshold is greater than the first temperature threshold and the second temperature management effort value is limited to a second value. The method further includes selecting the maximal value of the first and the second temperature management effort values as an operational temperature management effort value.

According to yet another embodiment of the invention, a control system for controlling an attribute of a computing device includes a plurality of independent linked controllers configured to receive a current value of the attribute associated with at least a portion of the computing device. The plurality of independent linked controllers are further configured to determine a plurality of individual control effort values based on the current value of the attribute. The system further includes a control device configured to apply a maximum control effort value of the plurality of individual control effort values to manipulate the attribute.

Other aspects and advantages of the invention will become apparent from the following detailed description taken in conjunction with the accompanying drawings which illustrate, by way of example, the principles of the described embodiments.

BRIEF DESCRIPTION OF THE DRAWINGS

The described embodiments and the advantages thereof may best be understood by reference to the following description taken in conjunction with the accompanying drawings. These drawings in no way limit any changes in form and detail that may be made to the described embodiments by one skilled in the art without departing from the spirit and scope of the described embodiments.

DETAILED DESCRIPTION

Representative applications of methods and apparatus according to the present application are described in this section. These examples are being provided solely to add context and aid in the understanding of the described embodiments. It will thus be apparent to one skilled in the art that the described embodiments may be practiced without some or all of these specific details. In other instances, well known process steps have not been described in detail in order to avoid unnecessarily obscuring the described embodiments. Other applications are possible, such that the following examples should not be taken as limiting.

In the following detailed description, references are made to the accompanying drawings, which form a part of the description and in which are shown, by way of illustration, specific embodiments in accordance with the described embodiments. Although these embodiments are described in sufficient detail to enable one skilled in the art to practice the described embodiments, it is understood that these examples are not limiting; such that other embodiments may be used, and changes may be made without departing from the spirit and scope of the described embodiments.

Figure 1:
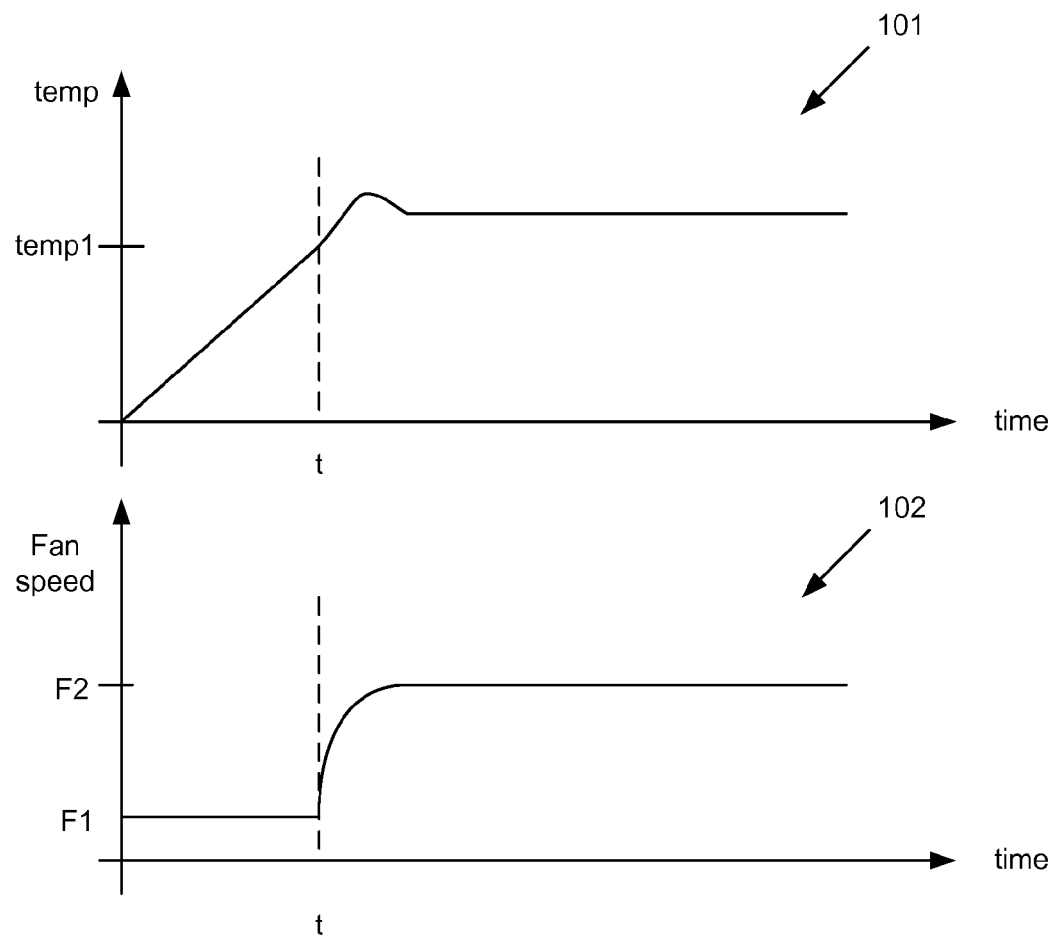
FIG. 1 are a simplified graphs showing a behavior of a conventional, simple control system, such as a control system for cooling a computing device.

FIG. 1 illustrates simplified graphs showing a behavior of conventional, simple control system, such as a control system for cooling a computing device. In this example, there can be a first temperature threshold temp1. As shown in graph 101, if the computing device is operating below temp1, then the fan speed can be a constant F1 (as shown on graph 102). As temperature increases above temp1 as shown at time t (shown on graph 101), the fan speed can begin to increase. In this example, the fan speed can increase to a second constant speed F2. In response, the temperature may slightly overshoot at time=t, but then come to rest at an operating point.

Figure 2:
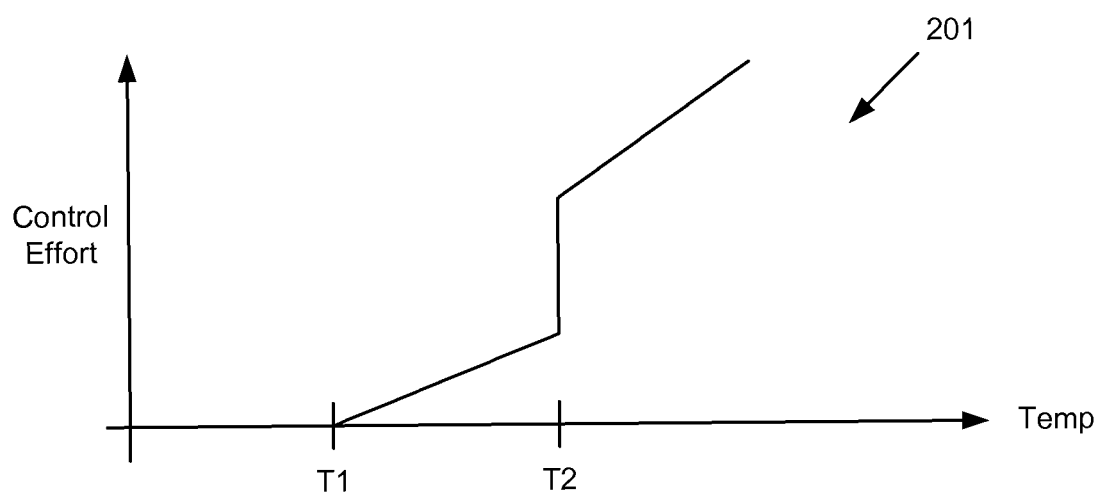
FIG. 2 shows an exemplary graph of control effort expended to cool a computing device.

The control system described in FIG. 1 can be described in more general terms using "control effort" to describe the effort expended to cool the computing device. The control effort, in this case, can relate to fan speed. FIG. 2 shows an exemplary graph 201 of control effort expended to cool a computing device. As temperature increases and passes through temp T1, a control effort can steadily be exerted to cool the computing device. As shown, the control effort is linear, but other control effort (i.e. non-linear) approaches can be taken. Drawing analogies to the fan system described in FIG. 1, the control effort can be analogous to fan speed. As temperature reaches temp T2, control effort can greatly increase. The graph of FIG. 2 is meant only to be an exemplary control effort profile. Many other profiles are possible.

One drawback of many control systems is that related control effort behaviors are based on and around a single operating point. For example, as shown in FIG. 2, the exemplary control effort profile illustrated therein is responsive only around operating point T2.

Figure 3:
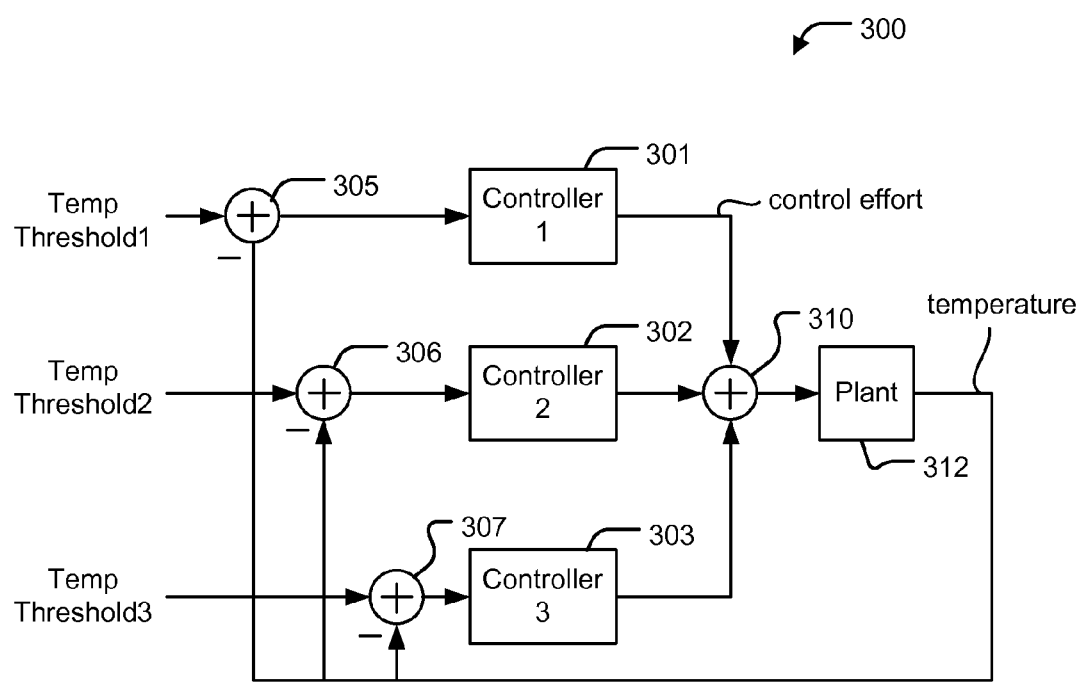
FIG. 3 is a block diagram of a linked multiple control system, in accordance with exemplary embodiments.

FIG. 3 is a block diagram of a linked multiple control system 300, in accordance with exemplary embodiments. In one embodiment, FIG. 3 can represent a high level block diagram of a linked multiple control system that can be applied to any system, such as a computing device. The control system can include N multiple controllers. In this example, there are 3 controllers, 301, 302, 303, which are easily extensible to more or less controllers than those particularly illustrated. Each controller 301, 302, 303, can operate independently of one another. In one embodiment, the controllers 301, 302, 303, can operate in parallel. The "plant" 312 can represent the system being controlled. In the case of a computing device, the plant 312 can include computing subsystems such as a processor, a graphics processing unit, a screen backlight, a charging system and/or a radio module. Other computing devices can include other subsystems.

Each controller 301, 302, 303, can have a control effort profile. The control effort profile can specify an amount of control effort to exert to control the plant 312 to operate at an operating point. In one embodiment, control effort can be between 0% and 100%. In another embodiment, each controller 301, 302, 303, can operate within an operating range. In one embodiment, the operating range of one controller can be independent of (i.e., does not overlap) the operating ranges of other controllers. In one embodiment, each controller 301, 302, 303, can be implemented as a proportional, integral, derivative controller (PID Controller).

Each controller 301, 302, 303, can receive a temperature from the plant 312. In one embodiment, the temperature can be an operating temperature. Each controller 301, 302, 303, can develop a control effort output. The control effort in this example may be termed a temperature management effort value. In one embodiment, the control effort outputs from all controllers 301, 302, 303, can be summed together at control device 310 and applied to the plant 312. In another embodiment, the although the controllers 301, 302, 303, can operate in parallel, the output of the controllers 301, 302, 303, can be output sequentially such that only one controller output is active at a time. In yet another embodiment, the control effort outputs of all controllers 301, 302, 303, can be compared and the largest control output can be applied to the plant 312. As shown, in one embodiment, the input to each controller 301, 302, 303, can be a difference signal in accordance with a difference between a target (threshold) temperature and a current operating temperature as determined in difference blocks 305, 306, 307. In one embodiment, each controller 301, 302, 303, can be associated with a different temperature threshold including generally illustrated Threshold 1, Threshold 2, and Threshold 3.

Figure 4:
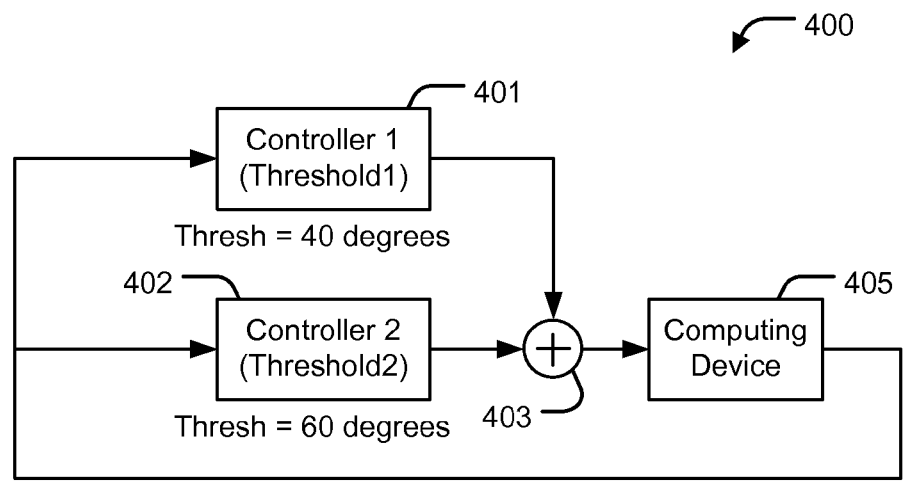
FIG. 4 is a simplified linked multiple control system block diagram, in accordance with exemplary embodiments.

FIG. 4 is a simplified block diagram of a linked multiple control system 400. Elements and behaviors of the linked multiple control system 300 described above can be described through an exemplary embodiment of a temperature control system 400 of a computing device 405 as shown in FIG. 4. As shown, two controllers 401, 402 can operate in parallel to control the temperature of the computing device 405. In this embodiment, each controller 401, 402 can have a unique temperature threshold. As each controller 401, 402 operates, each controller can calculate an amount of control effort to expend to cool the computing device 405. For example, each controller 401, 402 can calculate an amount of control effort based on detected temperature (shown input from computing device) and a control effort profile. In one embodiment, the control effort profile can be bound within each controller 401, 402, and the control effort bounds can be different within each controller. A control effort bound can be a limit on the amount of control effort that a controller may apply. For example, if the range of control effort is between 0 and 100%, the output of any one controller may be bound (limited) to a value less than the maximum 100%. Any number of controllers is feasible, although only two are shown here.

In one embodiment, the output of the controllers 401, 402 can be summed at summing element 403 (e.g., control device) and delivered to the computing device 405. In another embodiment, the output of the controllers 401, 402 can be compared, and only the output representing the greatest control effort can be delivered to the computing device 405. In one embodiment, the delivered control effort can be mapped to operational parameters for processors, graphics processing units, backlight controllers, radio transmitters, battery chargers or any other component of the computing device 405.

By way of an example, Controller 1 (401) can have a temperature threshold of 40 degrees and a maximum effort limit of 40%. Controller 2 (402) can have a temperature threshold of 60 degrees and a maximum effort limit of 80%. In one embodiment Controller 2 can be configured to not exert any control effort until temperature exceeds the temperature threshold of 60 degrees. In other words, Controller 2 can output 0% effort until the temperature exceeds 60 degrees.

Figure 5:
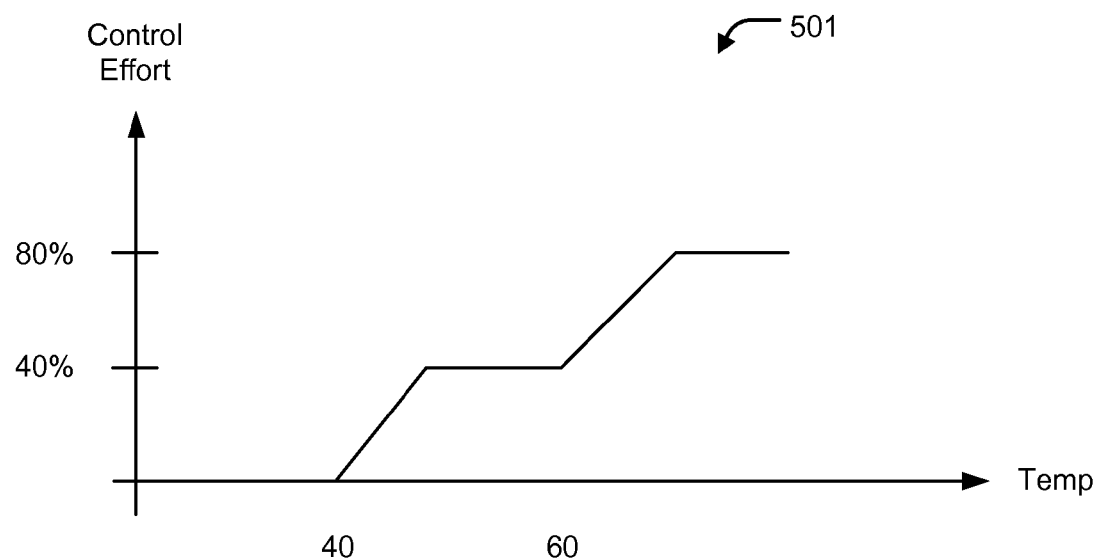
FIG. 5. is a graph showing control effort output from the system in FIG. 4 supplied to the computing device in response to temperature.

FIG. 5. is a graph 501 showing control effort output from the system in FIG. 4 supplied to the computing device in response to temperature. As temperature begins below the first temperature threshold (40 degrees), no control effort is made. As temperature exceeds the first temperature threshold, control effort can be exerted by the first controller (e.g., 401). In one embodiment, control effort for the first controller can be limited to 40%. After the control effort reaches 40%, the control effort is effectively bound until the temperature exceeds the second temperature threshold of the second controller (e.g., 402). In this example, as the temperature exceeds 60 degrees, the second controller outputs an increasing control effort until the max control effort (bound limitation) for the second controller is reached at 80%. At this point, no other changes in control effort occur. However, additional controllers can also be linked, each having differing thresholds and control effort bounds, to effectively allow manipulation of the graph 501 to complement any desired control effort profile for a computing device.

Although described sequentially, in other embodiments, the first and the second controllers can function in parallel. In one embodiment, the outputs of both controllers can be compared and the controller producing a maximal control effort signal can be selected and applied to the computing device.

Figure 6:
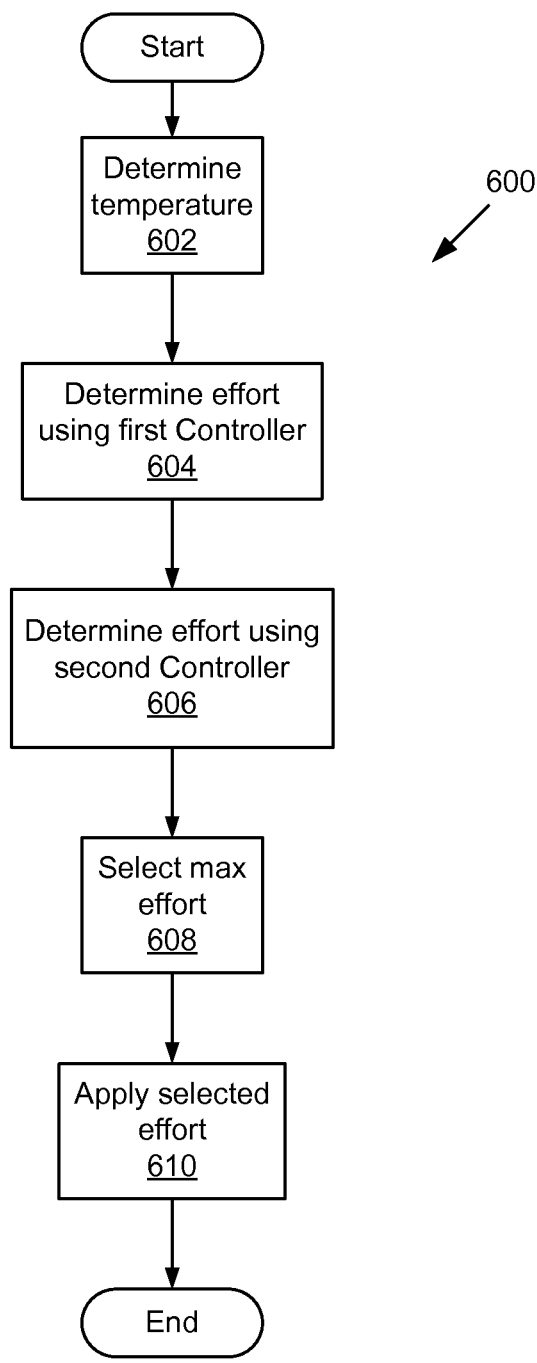
FIG. 6 is a flow chart of a method of controlling a computing device with a linked independent control system, according to an exemplary embodiment.

FIG. 6 is a flow chart of a method 600 of controlling a computing device with a linked independent control system, according to an exemplary embodiment. The method can being in step 602 where the temperature of the computing device (e.g., 405) is determined. In step 604, a first controller (e.g., 401) can determine a first control effort. In one embodiment, a control effort can be derived in accordance with the determined temperature. In step 606, a second controller (e.g., 402) can determine a second control effort. In one embodiment, the second control effort can be derived in accordance with the determined temperature. In step 608, the first and the second control efforts are compared and the largest control effort is selected. In stop 610, the selected control effort is applied to the computing device and the method ends.

Generally, the control effort referenced hereinabove and in method 600 is a function of the determined temperature as it relates to a plurality of heat sources in the computing device being controlled. For example, control effort may be expressed as an abstraction of effort required to maintain, reduce, and/or otherwise control a temperature of the device. In some instances this may include limiting a central processing unit's frequency or voltage level, for example, through the implementation of performance caps. In some instances this may include limiting a graphical processing unit's frequency or voltage level. Still in further instances this may include setting backlighting intensity or voltage caps to reduce heat dissipated from a light source. In yet even further instances this may include setting power caps for cellular radio transmission, battery charging profile manipulation, or any other suitable control effort which results in decreased temperature. Thus, as described above, control effort is a function of the effort necessary to reduce, maintain, or otherwise control a temperature of the device such that increasing control effort results in decreased performance of one or more of the above-references components. This decreased performance may be balanced to reduce any negative consequences as related to user experience, and may itself be capped (e.g., at a percentage of control effort as illustrated in FIG. 5) in some embodiments.

Figure 7:
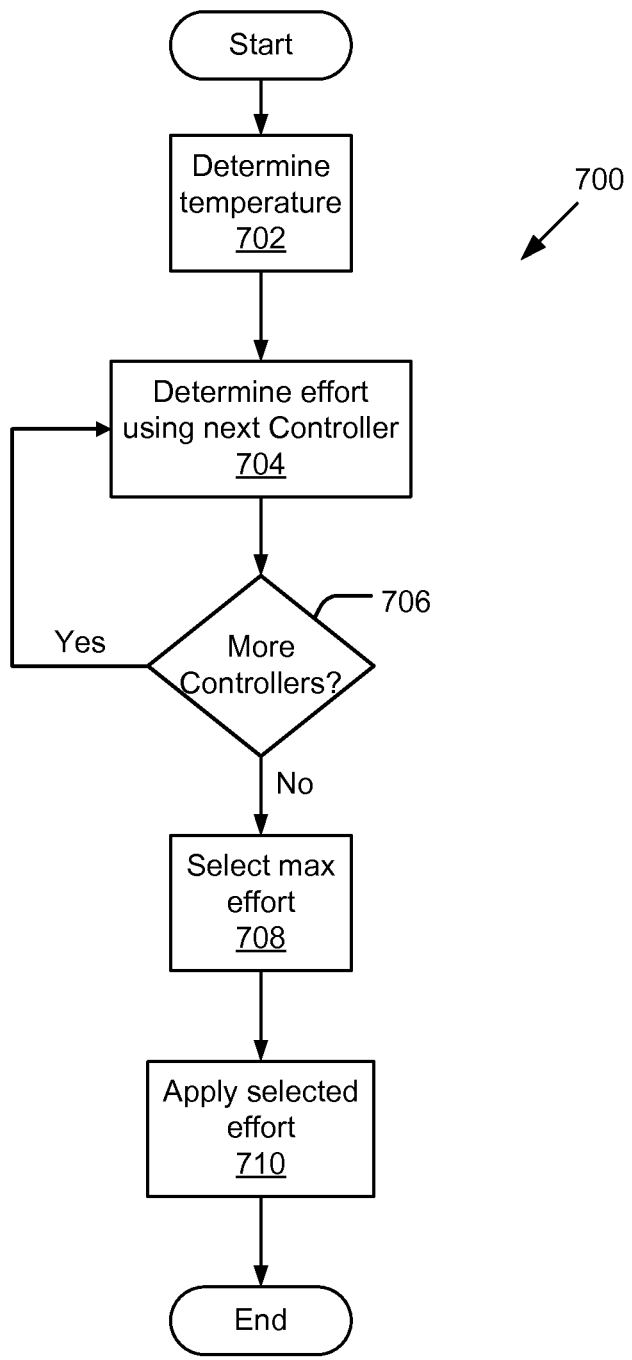
FIG. 7 is a flow chart of a method of controlling a computing device with a linked independent control system, according to an exemplary embodiment.

Additionally, although described above as relating to two or three linked controllers, it should be readily understood that the same may be varied in many ways. For example, FIG. 7 is a flow chart of a method 700 of controlling a computing device with a linked independent control system, according to an exemplary embodiment. The method can being in step 702 where the temperature of a computing device is determined. In step 704, a controller (e.g., a next controller) can determine a control effort. In step 706, it is determined whether additional controllers are linked in the system. If so, the method iterates through steps 704-706 to determine control efforts for each controller. In step 708, the determined control efforts are compared and the largest control effort is selected. In step 710, the selected control effort is applied to the computing device and the method ends. Therefore, multiple controllers may be used according to any desired implementation. Additionally, although described in a sequential manner it should be understood that processing and determining of control efforts may occur substantially in parallel, partially in parallel, or may be otherwise determined without departing from exemplary embodiments.

The various aspects, embodiments, implementations or features of the described embodiments can be used separately or in any combination. Various aspects of the described embodiments can be implemented by software, hardware or a combination of hardware and software. The described embodiments can also be embodied as computer readable code on a computer readable medium for controlling manufacturing operations or as computer readable code on a computer readable medium for controlling a manufacturing line. The computer readable medium is any data storage device that can store data which can thereafter be read by a computer system. Examples of the computer readable medium include read-only memory, random-access memory, CD-ROMs, HDDs, DVDs, magnetic tape, and optical data storage devices. The computer readable medium can also be distributed over network-coupled computer systems so that the computer readable code is stored and executed in a distributed fashion.

The foregoing description, for purposes of explanation, used specific nomenclature to provide a thorough understanding of the described embodiments. However, it will be apparent to one skilled in the art that the specific details are not required in order to practice the described embodiments. Thus, the foregoing descriptions of specific embodiments are presented for purposes of illustration and description. They are not intended to be exhaustive or to limit the described embodiments to the precise forms disclosed. It will be apparent to one of ordinary skill in the art that many modifications and variations are possible in view of the above teachings.

What is claimed is:

1. A method for controlling temperature of a computing device, the method comprising:
   determining a current operating temperature associated with at least one operational component of the computing device;
   determining, based on the current operating temperature, a control effort output for each controller of a plurality of controllers of the computing device;
   selecting a controller from the plurality of controllers that provides a greatest control effort output amongst the control effort outputs; and
   applying, using the selected controller, the greatest control effort output to control the current operating temperature.

2. The method of claim 1, wherein each control effort output comprises an amount of control effort to control the current operating temperature of the at least one operational component to operate at a predetermined operating point.

3. The method of claim 1, wherein at least one controller of the plurality of controllers comprises a proportional, integral, derivative (PID) controller.

4. The method of claim 1, wherein determining the plurality of control effort values comprises:
   determining, at each controller of the plurality of controllers, a control effort output within an operating range of each of the plurality of controllers.

5. The method of claim 4, wherein the operating range of each controller are non-overlapping.

6. The method of claim 5, wherein the operating range of each controller is partially overlapping.

7. The method of claim 1, wherein the plurality of controllers comprises:
   a first controller configured to output a control effort within a first operating range; and
   a second controller configured to output a control effort within a second operating range independent of the first operating range such that there is no overlap between the first operating range and the second operating range.

8. The method of claim 1, wherein the greatest control effort output causes an operational limitation to the operational component.

9. A method for controlling temperature of a computing device, the method comprising:
   determining a current operating temperature of the computing device;
   computing a first control effort with a first temperature controller of the computing device when the current operating temperature exceeds a first temperature threshold;
   computing a second control effort with a second temperature controller of the computing device when the current operating temperature exceeds a second temperature threshold greater than the first temperature threshold; and
   controlling the current operating temperature by selecting at least one of the first control effort from the first controller and the second control effort from the second controller.

10. The method of claim 9, wherein a sampling rate of the first temperature controller is slower than a sampling rate of the second temperature controller.

11. The method of claim 10, wherein the first temperature controller and second temperature controller each comprise a proportional, integral, derivative (PID) controller.

12. The method of claim 9, wherein:
    the first temperature control functions according to a first operating range,
    the second temperature control functions according to a second operating range that does not overlap with the first operating range.

13. The method of claim 9, wherein:
    the first temperature control functions according to a first operating range,
    the second temperature control functions according to a second operating range that partially overlaps with the first operating range.

14. The method of claim 9, wherein the first control effort is bound by a first limit, and wherein the second control effort is bound by a second limit greater than the first limit.

15. The method of claim 9, wherein controlling the current operating temperature comprises regulating the current operating temperature with only the first control effort from the first temperature controller when the current operating temperature exceeds the first temperature threshold but does not exceed the second temperature threshold.

16. The method of claim 15, wherein controlling the current operating temperature comprises using both the first control effort of the first temperature controller and the second control effort of the second temperature controller when the current operating temperature exceeds the second temperature threshold.

17. A control system for controlling temperature of a computing device, the control system comprising:
    a plurality of controllers configured to receive a current operating temperature associated with at least one operational component of the computing device, wherein each of the plurality of controllers provides a control effort output based on the current operating temperature, and wherein the computing device is configured to select a greatest control effort output from the control effort outputs of the plurality of controllers and apply the greatest control effort output
    to control the current operating temperature of the computing device.

18. The control system of claim 17, wherein each control effort output comprises an amount of control effort to control the current operating temperature of the at least one operational component to operate at a predetermined operating point.

19. The control system of claim 17, wherein the plurality of controllers comprises a plurality of independent linked controllers.

20. The control system of claim 17, further comprising a control device configured to sum the control effort outputs of the plurality of controllers to control the current operating temperature of the computing device.

* * * * *